US005654662A

United States Patent [19]

Prentice

[11] Patent Number: 5,654,662

[45] Date of Patent: Aug. 5, 1997

[54] INVERTED BJT CURRENT SOURCES/SINKS IN RF CIRCUITS AND METHODS

[75] Inventor: John S. Prentice, Palm Bay, Fla.

[73] Assignee: Harris Corporation, Melbourne, Fla.

[21] Appl. No.: 506,978

[22] Filed: Jul. 28, 1995

[51] Int. Cl.$^{6}$ .................................................... H03K 17/60

[52] U.S. Cl. ........................... 327/478; 327/482; 327/574

[58] Field of Search .................................... 327/538, 478, 327/482, 427, 327, 563, 574; 326/48; 323/315, 317

[56] References Cited

U.S. PATENT DOCUMENTS 4,140,926 2/1979 Price ...................................... 327/327
4,326,135 4/1982 Jarrett et al. .............................. 327/65
4,669,026 5/1987 Widlar .................................... 361/103
5,317,208 5/1994 Banker et al. .......................... 323/315

*Primary Examiner*—Toan Tran
*Attorney, Agent, or Firm*—Rogers & Killeen

[57] ABSTRACT

A integrated circuit, high impedance, current source/sink for wireless communications systems comprising one or more inverted bipolar junction transistors, and a method of ensuring high output impedance at RF frequencies. Mixers, differential amplifiers and transconductance amplifiers are disclosed as is the physical structure of bipolar transistors including heterojunction transistors.

26 Claims, 6 Drawing Sheets

INVERTED BJT CURRENT SOURCES/SINKS IN RF CIRCUITS AND METHODS

BACKGROUND OF THE INVENTION

The present invention relates to current sources/sinks for wireless communication systems and more particularly to such sources/sinks wherein the output impedance remains high at RF frequencies. As used hereinafter in the specification and claims, "current source" is intended to be generic to both current sources and sinks.

High impedance current sources are often desirable in RF communications systems. The use of bipolar junction transistors ("BJTs") to amplify the RF signal is well known. However, BJTs with a Ft sufficiently high for such applications suffer as a result of the reduction in gain at such high frequencies. In many applications involving integrated circuits, such high frequency BJT transistors are the only transistors available on the integrated circuit and the lack of output impedance when in use as a current source remains a problem.

BJTs are of course well known and have base, collector and emitter terminals. Structurally, the emitter and collector terminals of early BJTs were identical and interchangeable and interchanged. Since, however, the gain of a transistor decreases with frequency to unity at the transfer frequency Ft, it is generally desirable to operate transistors at a small fraction of Ft in order to achieve amplification. As a result, the emitters and collectors of modern BJTs with a Ft of at least 1 GHz, perhaps as much as at 10 GHz, are quite different structurally in integrated circuits designed for operation at frequencies of at least 300 MHz, and desirably 500–1,000 MHz. These physical differences result in a transistor in which the operating characteristics are very different when the transistor is inverted, i.e., when the collector and emitter terminals are interchanged.

It is also known to use inverted BJTs in current sources for the purpose of reducing the power supply requirements of the circuits and thus power dissipation. By way of example, the Banker et al U.S. Pat. No. 5,317,208 discloses the use of such sources for logic gates.

Accordingly, it is an object of the present invention to provide a novel current source and method in which the output impedance of high frequency, integrated circuits useful in wireless communications systems can be significantly increased.

It is another object of the present invention to provide novel RF circuits and methods of using inverted BJTs.

It is yet another object of the present invention to provide a novel structure and method for current sources with higher output impedance and with a lower transition frequency.

It is yet still another object of the present invention to provide a novel structure and method for increasing the common mode rejection of a differential amplifier at frequencies above 300 MHz.

It is still another object of the present invention to provide a novel heterojunction transistor and method with higher output impedance and a reduced transition frequency.

It is yet still another object of the present invention to provide a novel integrated circuit differential amplifier and method in which the bipolar junction transistors of a current source for biasing the normal mode bipolar junction transistors of the amplifier are operated in the inverted mode to increase the common mode rejection of the amplifier at frequencies above about 300 MHz.

It is yet still a further object of the present invention to provide a novel integrated circuit transconductance amplifier and method in which the bipolar junction transistors of a current source for biasing the normal mode bipolar junction transistors of the amplifier are operated in the inverted mode to increase the common mode rejection of the amplifier at frequencies above about 300 MHz.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
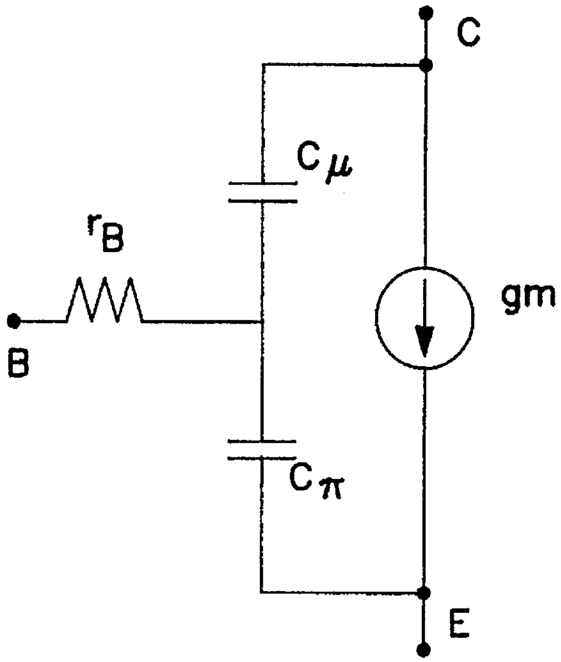
FIG. 1 is a schematic circuit diagram of a small signal model of a bipolar junction transistor for frequencies above one percent (1%) of the transition frequency Ft.
Figure 2:
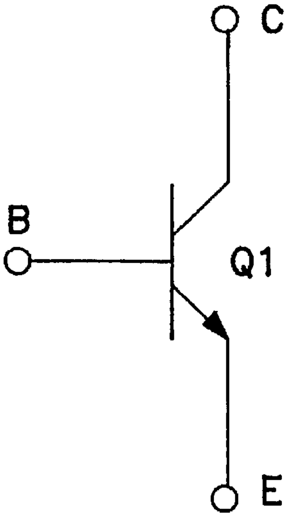
FIG. 2 is a schematic circuit representation of a bipolar junction transistor.

With. reference to FIGS. 1 where the NPN bipolar junction transistor of FIG. 2 is schematically represented as a hybrid pi or small signal model, the impedance looking into the collector C is $1/(g_m \alpha r_B)$ times the base-to-collector impedance Cμ, where $g_m$ is the transconductance of the base-to-emitter voltage VBE controlled current source and where $r_B$ is the resistance of the base. Since $r_B$ includes any external impedance at the base, the $g_m \cdot r_B$ product is often greater than 10 at moderate frequencies (e.g., about Ft/100).

At higher frequencies when the base-to-emitter impedance Cπ is less than $r_B$, the collector impedance becomes resistive and approaches a value of $(C\mu+C\pi)/(g_m \cdot C\mu)$. This is the magnitude of the collector impedance Cμ at the transition frequency Ft of the transistor, but occurs at a frequency as small as $Ft/g_m \alpha r_B$. By way of example, a current source which supplies 4.3 mA must have an impedance greater than 400 Ω at 400 MHz, i.e., <1 pf. This means that Cμ must be less than 80 ff assuming Ft=5 GHz or $r_B$<0.6 Ω.

However, if the current source transistor is operated in the inverted mode, the small frequency model remains unchanged but Cμ is now the capacitance associated with the terminal used as the collector rather than the emitter and Cπ is now the capacitance associated with the terminal used as the emitter rather than the collector.

Because of the smaller area of the old emitter relative to the old collector, operation of the transistor in the inverted mode reduces the value of Cμ, and significantly increases the value of Cπ because of the charge stored between the base and the buried layer of the old collector. The output impedance $(C\mu+C\pi)/(g_m \alpha C\mu)$ remains high because Ft is so low. Also, there is no collector (old emitter)-to-substrate capacitance and $r_B$ is smaller because the base-to-emitter (old collector) junction is larger than the base-to-collector (old emitter) junction. Operation is possible to lower the $V_{CE}$ values in the normal mode because of the lower collector resistance Rc (old emittter resistance Re) which are not shown in the model of FIG. 1. The disadvantages are the small β, small Early voltage and small $V_{CE}$max (breakdown voltage).

Figure 3:
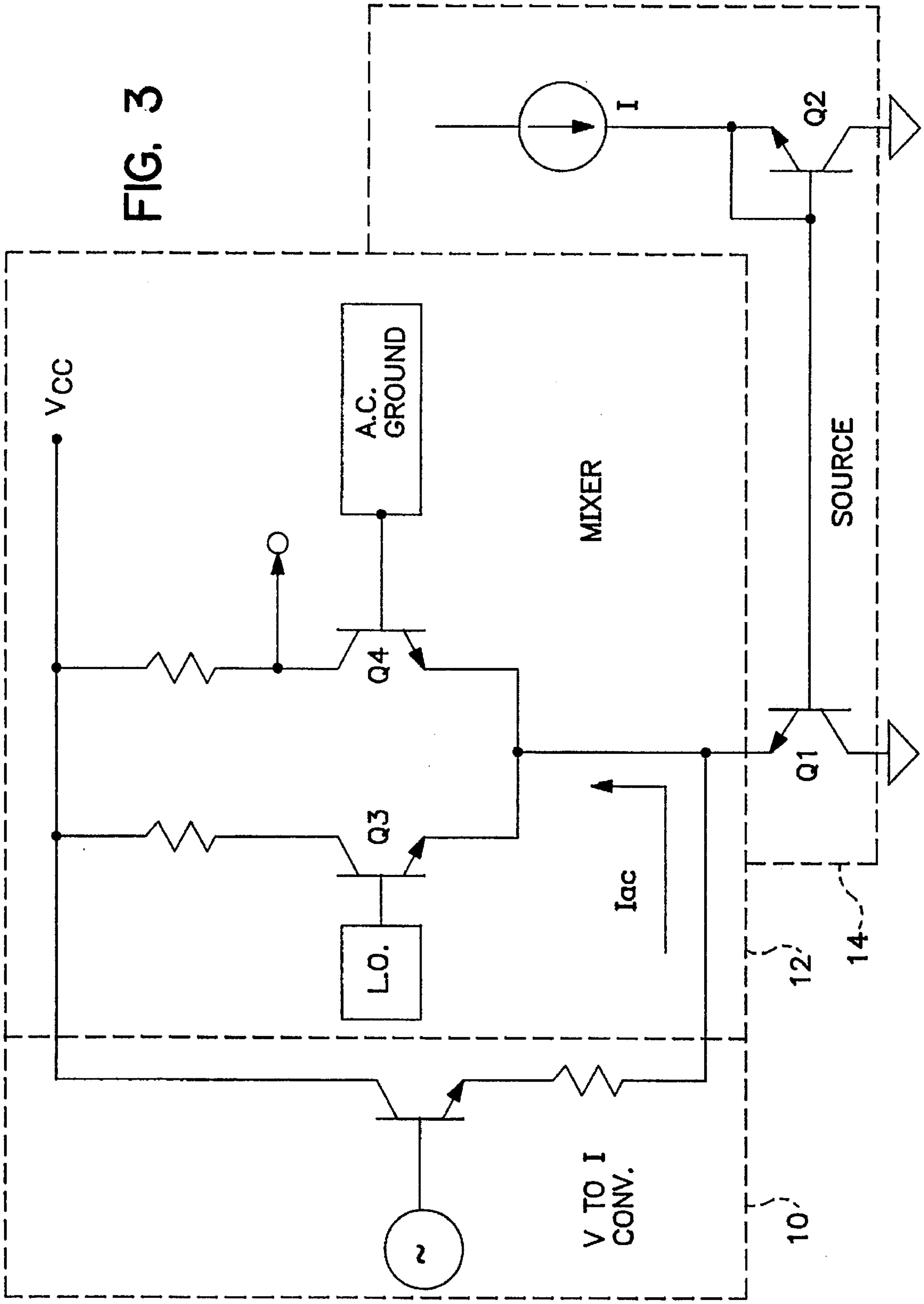
FIG. 3 is a schematic circuit diagram of one embodiment of a mixer of the present inventions.

With reference to FIG. 3, a voltage to current circuit 10 provides an a.c. current Iac to a mixer 12 which also receives current from a current source 14. The mixer 12 may be any suitable conventional balanced or unbalanced mixer having a local oscillator and an a.c. ground signal for chopping the signal Iac provided by the voltage to current circuit 10.

The current source 14 feeds the mixer 12 with a bias current and as shown includes a suitable conventional source which provides a current I through the diode Q2. The current through the diode Q2 is mirrored through the transistor Q1 in the path of the alternatively conducting transistors Q3 and Q4 in the mixer 12.

The source of bias current 14 must have a high output impedance to prevent the diversion of the a.c. current Iac into the source. To provide that high output impedance, the transistors Q1 and Q2 are invented so that the electrical emitter connected to the mixer is the physically larger area of the transistor normally serving as the collector.

Figure 4:
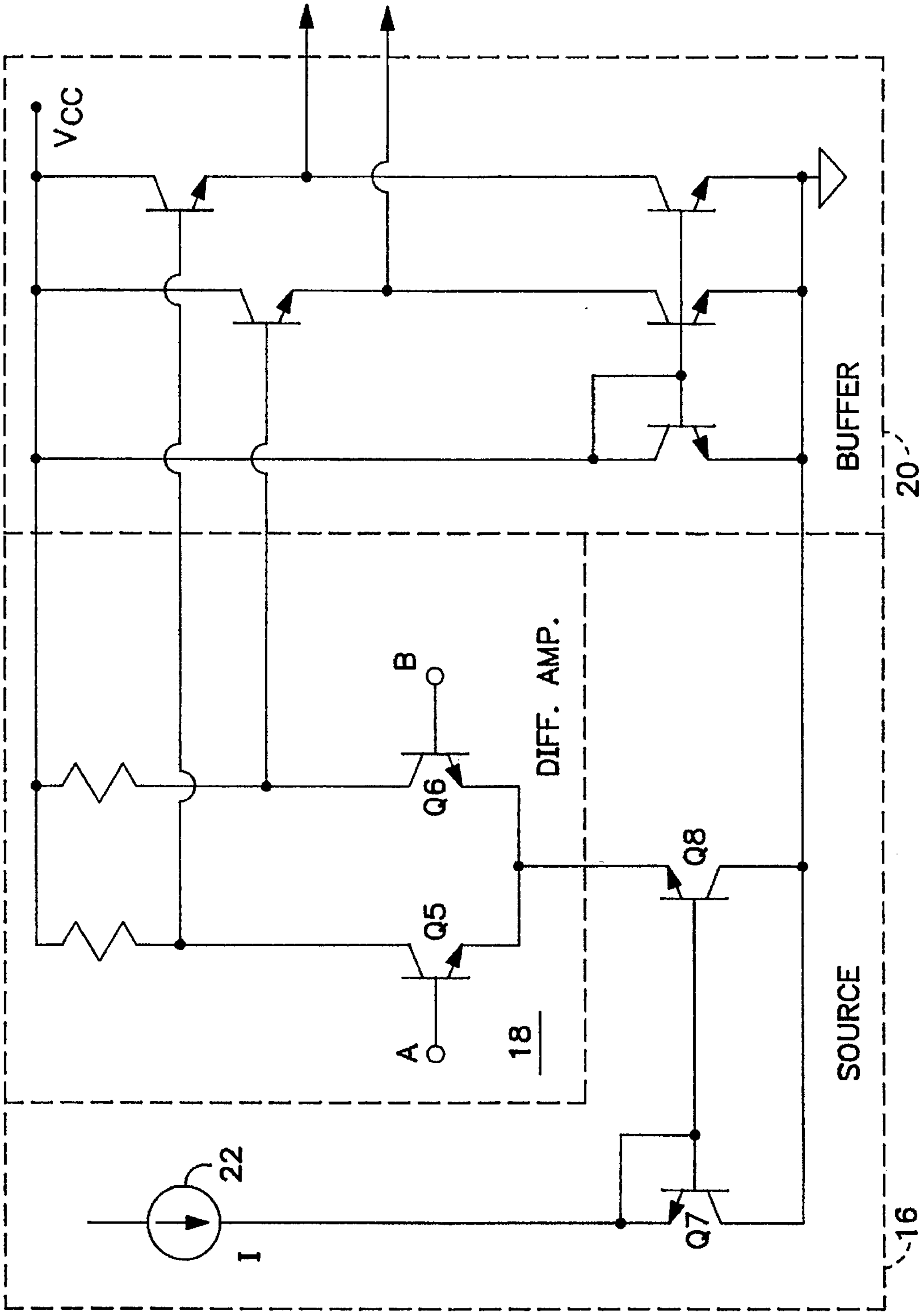
FIG. 4 is a schematic circuit diagram of one embodiment of a differential amplifier of the present inventions.

The high impedance current source of the present invention finds great utility in differential amplifiers operable at the high frequencies of wireless communications systems. With reference to FIG. 4, a source of bias current 16 is connected to a differential amplifier 18 whose two output signals are buffered in a suitable conventional multiple stage buffer 20.

It is desirable that the current source which feeds the two transistors Q5 and Q6 to which the inputs signals A and B are applied have a high output impedance. In the circuit of FIG. 4, this high output impedance is obtained by reversal of the electrical terminals of the transistors Q7 and Q8 within the source 16. In operation, the current from the source 22 through the diode Q7 is mirrored through the inverted transistor Q8. Without the high output impedance, a single input signal A or B would not provide a balanced differential output current.

Operation of the transistors in the current source in the inverted mode significantly increases the common mode rejection of the amplifier.

Figure 5:
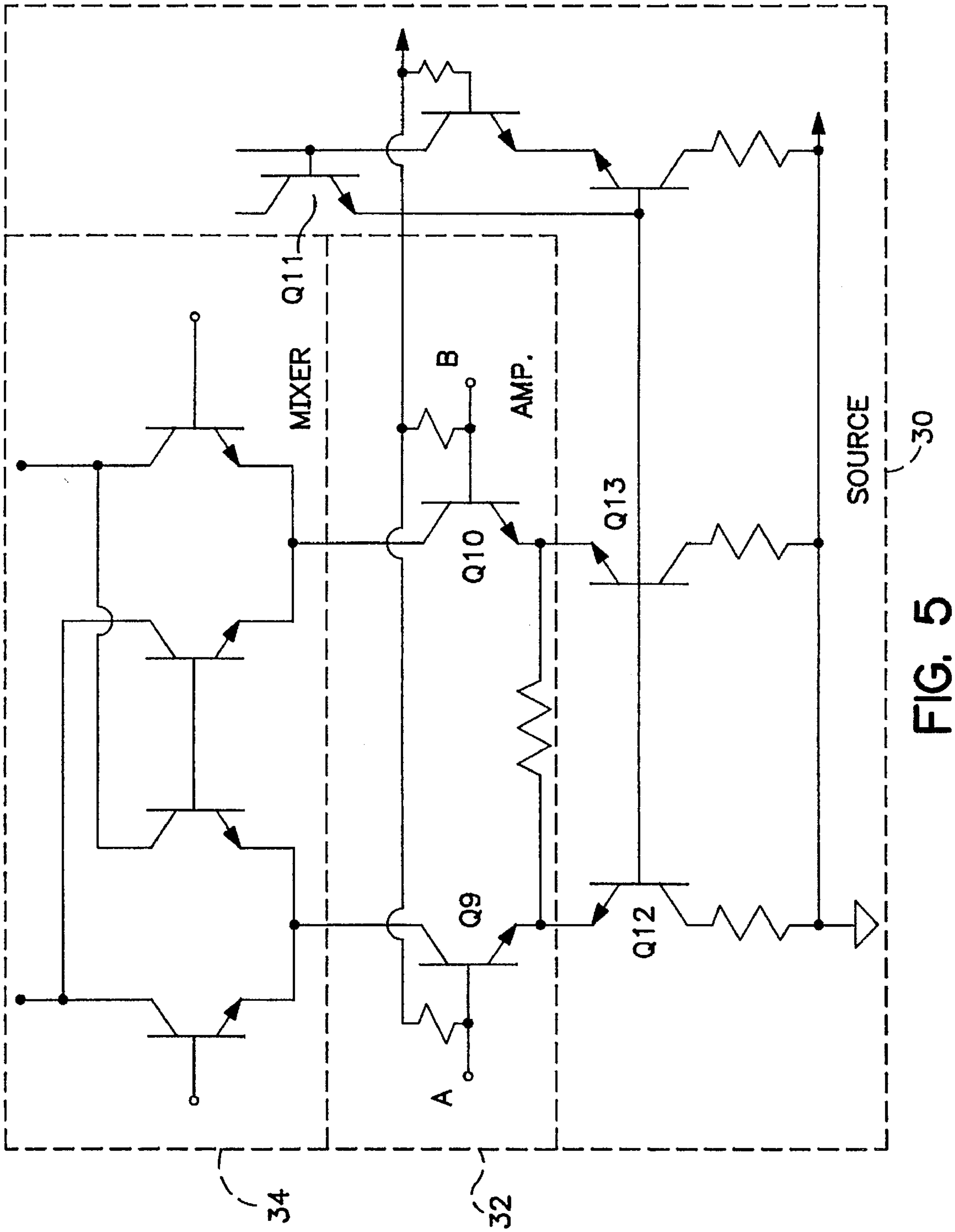
FIG. 5 is a schematic circuit diagram of one embodiment of a transconductance amplifier of the present inventions.

The high output impedance current source of the present invention also finds great utility in transconductance amplifiers such as shown in FIG. 5. With reference to FIG. 5, a source 30 is connected through a transconductance amplifier 32 to a mixer 34. The mixer may be any suitable conventional double balanced mixer, in this instance provided with separately amplified sources of bias current through the transistors Q9 and Q10. The current from the source (not shown) through the transistor Q11 is mirrored through the transistors Q12 and Q13 to the respective emitters of the transistors Q9 and Q10 of the amplifier 32.

The high output impedance of the source is achieved by the inversion of the transistors Q12 and Q13, i.e., by the reversal of the electrical connections thereof from the norm. The use of a single transistor Q14 to provide the base current to all of the inverted transistors minimizes errors due to the small β of the transistors when operated in the inverted mode.

Without the high output impedance of the current source 30, an a.c. signal A or B applied to the base of one of the amplifier transistors Q9 and Q10 would not result in a balanced differential output signal to the mixer 34.

A high output impedance may also be achieved with reversal of the electrical terminals of a heterojunction transistors in which the band gap of the normal mode emitter is engineered to improve normal current gain. A heterojunction transistor comprises layers of semiconductor having different energy gaps, e.g., germanium doped silicon and silicon and silicon carbide and silicon.

Figure 6:
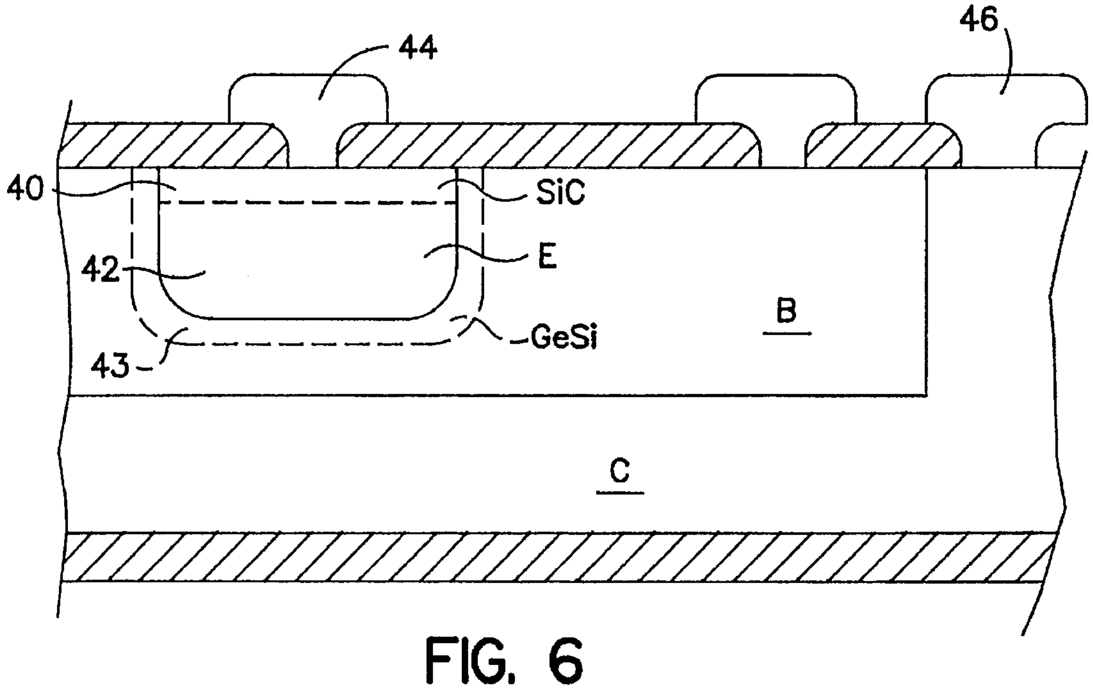
FIG. 6 is a vertical cross-section of one embodiment of a heterojunction transistor of the present inventions.

For example and as shown in FIG. 6, a thin (e.g., about 25 to 100 Å) layer 40 of silicon carbide SiC with its wide energy band gap may be added within the normal emitter 42 adjacent the upper surface thereof by any conventional doping technique. When operated in the inverted mode by reversal of the electrical connections at the terminals 44 and 46, the difference in junction potential between the emitter-base and collector-base will cause the transistor to operate with a lower $V_{CE}$.

Alternatively, a thin layer of germanium doped silicon 43 with lower energy band gap may be added within the base adjacent its junction with the emitter 42.

Figure 7:
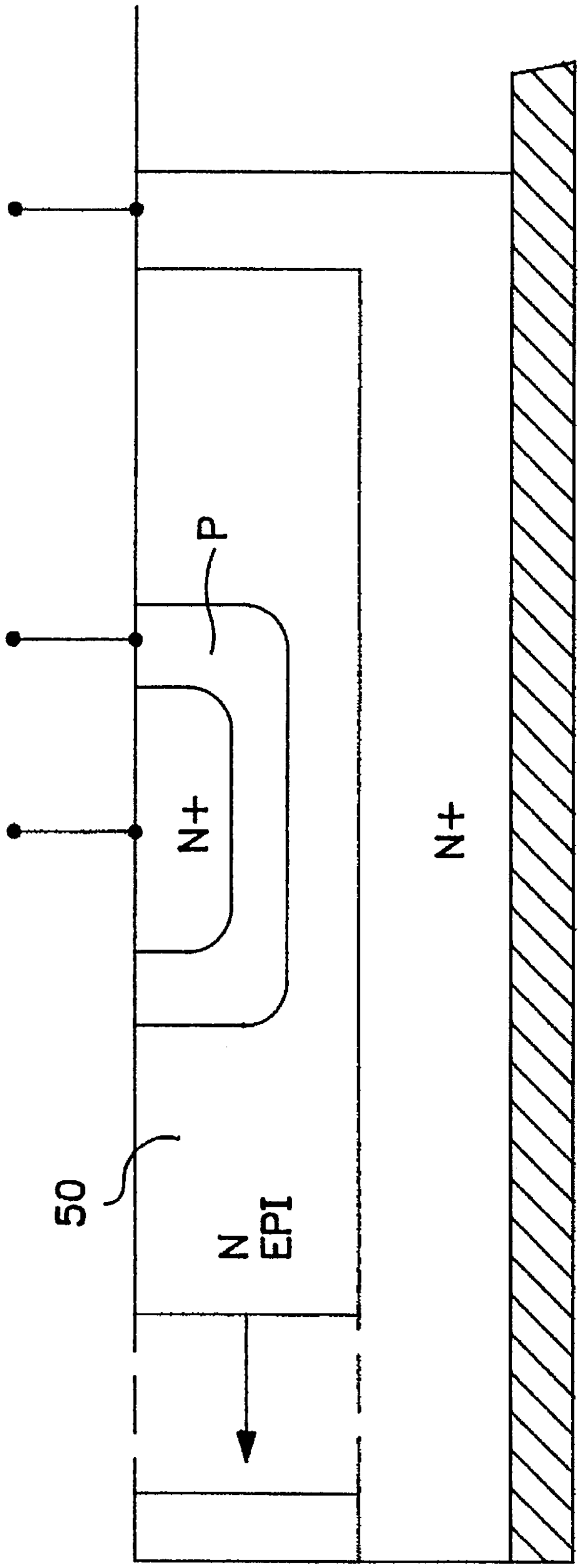
FIG. 7 is a vertical cross-section of a second embodiment of a transistor of the present inventions with a decreased Ft.

Since the high impedance at high frequencies is due to the charge stored in the epi, the area of the epi may be increased outside the area of the base to increase the total epi (charge storage) volume. For example, FIG. 7 illustrates a NPN transistor in which the volume of the lighter doped epi area of the collector is horizontally increased from near zero to about 10 microns. Because of the increase in the stored charge, $C_{\pi}$ increases and the high impedance operation of the transistor when operated in the inverted mode should begin at a smaller frequency with increased output impedance.

In modern transistors, the width of the base may be quite small, with one side adjacent the trench, to conserve surface area and to increase Ft when the transistor is operated in the normal mode. By increasing the horizontal dimension between the base and the trench to a maximum distance less than the process dependant diffusion length of about 30 to 40 microns, the volume of the collector in which charge can be stored is significantly increased.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. In an integrated circuit current source comprising one or more bipolar junction transistors with emitters physically small in area relative to collectors, a method of increasing the output impedance of the current source at frequencies above about 300 MHz comprising the step of reversing the electrical connections to the emitters and collectors of the transistors so that the electrical collector is attached to the area with the smallest area.

2. The method of claim 1 wherein the output impedance of the current source is increased at frequencies above about 500 MHz.

3. The method of claim 1 wherein the output impedance of the current source is increased at frequencies above about 1 GHz.

4. In an integrated circuit current source comprising one or more bipolar heterojunction transistors each having a base, emitter and collector and with the emitter physically small in area relative to collector, a method of increasing the output impedance of the current source at frequencies above about 300 MHz comprising the step of reversing the electrical connections to the emitters and collectors of the transistors so that the electrical collector is attached to the area with the smallest area.

5. The method of claim 4 wherein the output impedance of the current source is increased at frequencies above about 500 MHz.

6. The method of claim 4 wherein the output impedance of the current source is increased at frequencies above about 1 GHz.

7. The method of claim 4 wherein the transistors include a layer of germanium doped silicon within the base thereof adjacent the emitter.

8. The method of claim 4 wherein the transistors include a layer of silicon carbide within the emitter adjacent the upper surface thereof.

9. In an integrated circuit mixer including bipolar junction transistors electrically connected for normal mode operation and a current source including bipolar junction transistors for biasing the normal mode transistors, a method of increasing the output impedance of the current source at frequencies above about 500 MHz comprising the step of operating the transistors of the source in the inverted mode.

10. The method of claim 9 wherein the transistors operated in the inverted mode are heterojunction bipolar transistors.

11. In an integrated circuit differential amplifier including bipolar junction transistors electrically connected for normal mode operation and a current source including bipolar junction transistors for biasing the normal mode transistors, a method of increasing the common mode rejection of the amplifier at frequencies above about 300 MHz comprising the step of operating the transistors of the source in the inverted mode.

12. In an integrated circuit transconductance amplifier including bipolar junction transistors electrically connected for normal mode operation and a current source including bipolar junction transistors for biasing the normal mode transistors, a method of increasing the common mode rejection of the amplifier at frequencies above about 300 Mhz comprising the step of operating the transistors of the source in the inverted mode.

13. In a bipolar junction transistor having a nominal emitter volume small relative to the volume of the nominal collector, the method of increasing the output impedance of the transistor comprising the steps of:

(a) providing a thin layer of silicon carbide within the relatively small volume nominal emitter adjacent the surface of the transistor in contact with a first electrical contact associated with the nominal emitter; and (b) electrically reversing the electrical contacts of the nominal emitter and nominal collector so that the electrical collector is in direct electrical contact with the silicon carbide layer.

14. In a bipolar junction transistor having a nominal emitter volume small relative to the volume of the nominal collector, the method of increasing the output impedance of the transistor comprising the steps of:

(a) providing a thin layer of germanium doped silicon within the base adjacent the nominal emitter in contact therewith; and (b) electrically reversing the electrical contacts of the nominal emitter and nominal collector so that the electrical collector is in direct electrical contact with the nominal emitter.

15. A bipolar junction transistor having a base, a nominal collector with a relatively lighter doped epi area and a nominal emitter, the volume of the nominal emitter being small relative to the volume of the nominal collector, said epi area of the nominal collector extending laterally away from said base to thereby increase the available charge storage volume of said epi area; and an electrical collector operably connected to said nominal emitter and an electrical emitter operably connected to said nominal collector to thereby lower Ft and increase the output impedance of the transistor.

16. The transistor of claim 15 including a layer of silicon carbide within the nominal emitter in contact with the electrical contact associated with the nominal emitter.

17. The transistor of claim 15 including a layer of germanium doped silicon within the base adjacent the nominal emitter.

18. A bipolar junction transistor having a base, a nominal collector with a nominal emitter, the volume of the nominal emitter being small relative to the volume of the nominal collector;

one of (a) a layer of silicon carbide within the nominal emitter in contact with the electrical contact associated with the nominal emitter and (b) a layer of germanium doped silicon within the base adjacent the nominal emitter; and an electrical collector operably connected to said nominal emitter and an electrical emitter operably connected to said nominal collector to thereby increase the output impedance of the transistor.

19. The transistor of claim 18 where said layer is germanium doped silicon within the base adjacent the nominal emitter.

20. An integrated circuit mixer comprising:

at least two bipolar junction transistors electrically connected for normal mode operation in parallel;

a local oscillator connected to the base of one of said transistors;

a signal source operatively connected to the emitters of said two normal mode transistors;

a current source including at least one bipolar junction transistor, said source being operatively connected to the emitters of said two normal mode transistors for biasing the normal mode transistors and said at least one transistor being electrically connected for inverted operation to thereby provide a high output impedance at the application of a voltage at frequencies above about 300 Mhz.

21. An integrated circuit differential amplifier comprising:

at least two bipolar junction transistors electrically connected for normal mode operation in parallel;

an input signal connected to the base of one of said transistors;

a current source operatively connected to the emitters of said two normal mode transistors, said current source including at least one bipolar junction transistor for biasing the normal mode transistors and said at least one transistor being electrically connected for inverted operation to thereby provide a high output impedance at the application of voltage at frequencies above about 300 MHz.

22. An integrated circuit transconductance amplifier comprising:

at least two bipolar junction transistors electrically connected for normal mode operation in parallel with a common emitter and with each having a base for receiving one of two input signals; and a current source operatively connected to the emitters of said two normal mode transistors including at least one bipolar junction transistor for biasing said normal mode transistors, said at least one transistor being electrically connected for inverted operation to thereby provide a high output impedance at the application of voltage at frequencies above about 300 Mhz.

23. The method of claim 1 including the further step of physically increasing the volume of the epi area of the collectors of the transistors.

24. The method of claim 1 wherein each of the collectors includes an epi area surrounding the associated base, said epi area being lighter doped than the area of the collectors not immediately contiguous to the base; and including the further step of physically increasing the epi area of the collector to thereby increase the charge storage capacity of the collectors.

25. In a bipolar junction transistor having a base, an electrical emitter with a relatively lighter doped epi area contiguous to said base and an electrical collector, the volume of said electrical collector being small relative to the volume of said electrical emitter, the epi area of said electrical emitter extending laterally away from said base to thereby increase the available charge storage volume of the epi area of the electrical emitter to thereby lower Ft and increase the output impedance of the transistor.

26. A bipolar junction transistor having a base, an electrical emitter and an electrical collector, the volume of the electrical collector being small relative to the volume of the electrical emitter; and one of (a) a layer of silicon carbide within said electrical collector and (b) a layer of germanium doped silicon within the base adjacent the electrical collector whereby the output impedance of the transistor is increased.

* * * * *